United States Patent [19]
Fisher et al.

[11] Patent Number: 5,942,314
[45] Date of Patent: Aug. 24, 1999

[54] ULTRASONIC WELDING OF COPPER FOIL

[75] Inventors: Brian K. Fisher; Albert R. Fisher, both of Redmond, Wash.

[73] Assignee: Mitsui Mining & Smelting Co., Ltd., Ageo, Japan

[21] Appl. No.: 08/838,272

[22] Filed: Apr. 17, 1997

[51] Int. Cl.[6] .............................. B32B 27/14; B23K 1/06
[52] U.S. Cl. ................... 428/198; 428/636; 228/1.1; 228/2.1; 228/2.3; 228/110.1; 228/120
[58] Field of Search .................... 228/110.1, 2.1, 228/2.3, 1.1, 120, 198; 428/198, 636

[56] References Cited

U.S. PATENT DOCUMENTS

| | | | |
|---|---|---|---|
| 3,831,262 | 8/1974 | Luc | 228/110.1 |
| 4,925,507 | 5/1990 | Yamaguchi | 156/73.1 |
| 4,975,133 | 12/1990 | Gochermann | 156/73.1 |
| 5,082,160 | 1/1992 | Leigh | 228/110.1 |
| 5,120,590 | 6/1992 | Savage et al. | 428/198 |
| 5,153,050 | 10/1992 | Johnston | 428/209 |

FOREIGN PATENT DOCUMENTS 1217104  12/1970  United Kingdom ........... B23K 27/00

*Primary Examiner*—Deborah Jones
*Assistant Examiner*—Cathy F. Lam
*Attorney, Agent, or Firm*—Arnold White & Durkee

[57] ABSTRACT

A method and apparatus is disclosed for ultrasonically welding at their edges a strip of their copper foil to a second strip of supporting metal, preferably aluminum or stainless steel having a thickness greater than the copper foil. The welded strips are subsequently sheared into panels for use in making printed circuit boards.

19 Claims, 1 Drawing Sheet

ID-ULTRASONIC WELDING OF COPPER FOIL

BACKGROUND OF THE INVENTION

1. Field of the Invention

The present invention relates generally to the copper foils used in making printed circuit boards. More particularly, it concerns attaching copper foils to sheets of other metals to provide physical support for the foil and to facilitate their lamination to insulating substrates, such as glass fiber-reinforced resin prepregs, e.g. epoxy resins, or polymer films such as polymides.

2. Description of Related Art

The use of metal sheets as carriers for copper foils is known in the art. Electrodeposition of copper on metal sheets has been proposed in order to obtain very thin layers of copper, which might otherwise not be feasible. Typical foils used in making printed circuit boards are about 9 to 35 $\mu$m thick, but by electrodepositing on a supporting sheet of another metal it is possible to use thinner layers of copper. The copper is laminated to a substrate and then the supporting sheet is stripped away, leaving a thin layer of copper on the substrate from which circuit lines are made.

In U.S. Pat. No. 5,153,050 Johnston disclosed a method of supporting sheets of conventionally thick copper foil on heavier aluminum sheets and sealing the edges of the copper foil to the aluminum sheets with adhesive to prevent foreign particles from infiltrating between the two sheets and causing defects in the subsequently formed circuit lines. It has also been proposed to use a similar method using, instead of an aluminum sheet, another sheet of copper foil. For example, by applying adhesive to the edges of the sheets or mechanically joining the edges of the sheets.

While the method of Johnston has met with commercial success, it has certain disadvantages. Contamination of the copper foil and or the aluminum sheet by the adhesive may be a problem since all of the aluminum and part of the copper foil will be reclaimed after the copper foil has been laminated to the substrate. (The aluminum sheet is separated and a portion of the laminated board is trimmed away to remove the adhesive region). Applying adhesive and assembling the metal sheets is difficult and involves complex machinery to carry out on a commercial scale. Furthermore, copper and aluminum have different coefficients of thermal expansion so that during lamination, which is done under heat and pressure, distortion of the copper by the large expansion of aluminum may occur, introducing undesirable stresses in the copper clad laminate.

The present inventors have found an improved method of combining copper foils and aluminum or other metal sheets, which is simpler, less expensive, and avoids some of the problems discussed above. The method involves the aligning of continuous strips of copper foil and a second metal and the use of ultrasonic welding of the edges of the two metal strips. The bond is sufficient to permit handling of the joined sheets, but when separated no residual adhesive or extraneous metal is left to contaminate the copper and aluminum.

SUMMARY OF THE INVENTION

The method of the invention ultrasonically welds the edges of continuous strips of copper foil and a second metal, such as aluminum, taken from rolls, aligned, and then passed through at least one welding station at each edge of the aligned metal strips. The copper foil is placed under tension in a direction transverse to the direction in which it is moving in order to prevent buckling of the relatively thin copper foil when it passes through the welding stations. Only the edges of the metal strips are ultrasonically welded. The welded strips are cut into the desired panel sizes, leaving the cut edges unsealed by welding. The resulting panels provide a sheet of copper foil flat against the second metal sheet and the unsealed ends are sufficiently close together as to prevent most foreign particles from entering.

The ultrasonic welding heads contact the copper foil and press against a supporting idler contacting the second metal which makes it possible to adjust the force applied to the welding head. The operating conditions are chosen to provide adequate welding of the metals. In one embodiment a force up to about 20 lbs. (4.45N) is applied to the foil. The welding heads vibrate with a frequency of about 10–50 kHz and make contact with the foil for about 0.1 to 2 seconds. The welding heads preferably use a smooth surface in contact with the foil, although the more common roughened surface can be used.

In another aspect, the invention is a panel of copper foil ultrasonically welded to a second metal sheet, such as aluminum, at two edges, the remaining edges of the panel being unsealed by the ultrasonic welding and preferably not sealed at all. Thus, with rectangular panels the panels are congruent at all four edges, but only ultrasonically welded on two of the edges.

Figure 1:
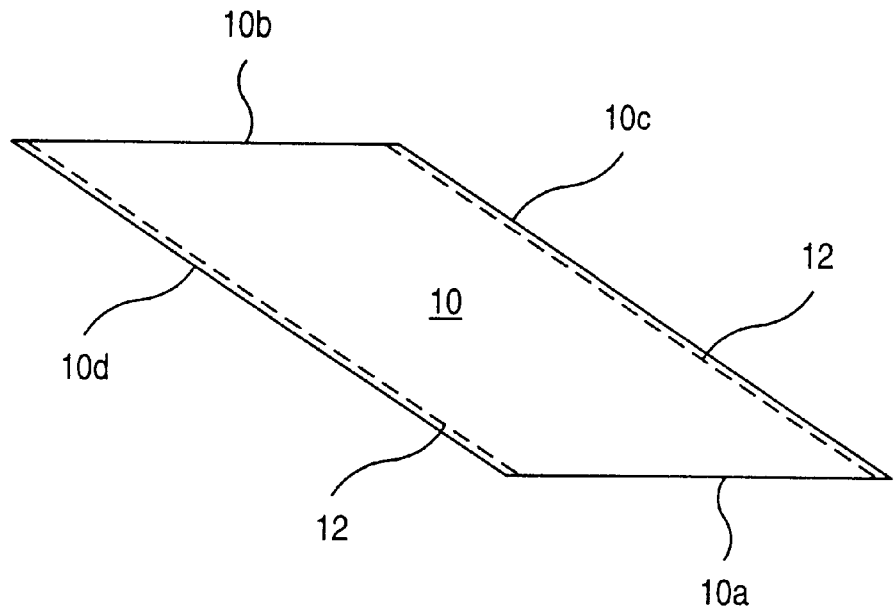
FIG. 1 is a perspective view of a panel according to the invention.

The drawings form part of the present specification and are included to further demonstrate certain aspects of the present invention. The invention may be better understood by reference to one or more of these drawings in combination with the detailed description of specific embodiments presented herein.

DESCRIPTION OF ILLUSTRATIVE EMBODIMENTS

Copper Foil

The copper foils used in making printed circuit boards generally have been electrodeposited from a copper solution onto a rotating drum from which they are removed, given further treatments, and then rolled for shipment. Alternatively, for some applications foils are used which have been mechanically rolled from copper stock into sheet form. Either of these foils could be used in the method of the invention, which is not limited as to the type of foil used. Copper foils have been made in many thicknesses. Most commonly for printed circuit boards thinner foils are used, typically in the range of 12 to 35 $\mu$m (⅜ to 1 oz/ft$^2$). Thinner foils can be used, although they are more difficult to make and handle. Thicker foils generally are considered uneconomic for most printed circuit board applications.

One of the advantages of the present invention is found in improved ability to handle thinner foils. When foils are laminated to an insulating substrate, such as glass fiber-reinforced epoxy resin prepregs or polymer films, e.g. polyimides, they are subjected to heat and pressure which cause the foil to be bonded to the substrate. If foils are already supported on thicker metal sheets, they are more easily handled when the copper foil and sheets of the substrate are assembled before they are placed in the heated presses used to make the laminates. The supporting metal sheets may also replace the stainless steel spacer plates conventionally used as separators.

Printed Circuit Boards

After copper foil has been laminated to its insulating substrate, it is removed from the press and used to manufacture printed circuit boards. In a typical process, the copperclad laminate undergoes photoimaging and development of the desired circuit pattern. After the pattern is photoimaged on the copper, the portion of the copper which is not to become part of the pattern is chemically etched away, thus leaving the circuit lines on the substrate. It will be evident that the copper foil must be firmly adhered to the substrate if it is to survive the processing used to make the circuit pattern.

It will also be evident that the presence of contaminants on the surface of the copper could interfere with the photoimaging of the circuit or the chemical etching of the unwanted foil. This is one reason for the development of supported foils as discussed by Johnston. The surface of the copper foil which is photoimaged and etched is covered by the supporting metal sheet during the lamination process, which helps to prevent epoxy resin particles or other extraneous contaminant particles from gaining access to the copper foil surface. Then, when the covering sheet is removed, the copper surface should be free of particles which could cause problems during the processing to make a printed circuit board. It is for this reason that the method used by Johnston and others to make a panel of copper foil and aluminum sheet emphasized the sealing of all of the edges of the panel with adhesive, including any tooling holes which may have been needed. While adhesives are effective to seal the edges of the sheets, they can lead to contamination of the copper foil. Also, adhesives will remain on the edges of the panels, which will be recycled to recover the copper and aluminum values. It would be desirable to avoid the use of adhesives if possible. Thus, it has been suggested that mechanical attachment of the copper foil and its supporting metal sheet would suffice. While use of mechanical fasteners would be possible, it will be appreciated that they may create problems owing to the difficulty in making a continuous seal and the possible distortion of the copper foil at the points where the two sheets are attached. Mechanical fasteners would contaminate scrap copper and aluminum. Consequently, the inventors have sought an improved method which provides a less expensive and continuous process to make panels useful in making printed circuit boards.

While the invention involves the use of ultrasonic welding, which has been used for various purposes, particularly for welding plastic films, it has been found that the application of the ultrasonic welding process to the assembling of copper foil with a supporting metal sheet is difficult since the copper foil is very thin and consequently is easily distorted. Furthermore, it was not certain that copper foil could be welded to the supporting sheet on two sides of continuous strips of metal and then sheared after welding, with the panels remaining unwelded on the edges where the shearing was done. However, the inventor's process is able to accomplish the desired result of producing a panel in which copper foil is flat on the supporting sheet and yet tightly welded at only two edges.

A typical panel is shown in a perspective view in FIG. 1. A rectangular panel 10 has four edges, 10a–d. Edges 10a and b are not welded, but 10c and d have been ultrasonically welded at welds 12. The cut edges 10a and b could be sealed by a separate ultrasonic welding step, adhesives, or other means, but it is not considered necessary for many applications. It should be noted that assembling the copper foil to its supporting metal sheet will be done under clean conditions so that contaminants usually found in circuit board shops will have been avoided.

Ultrasonic Welding

Ultrasonic welding involves the application of mechanical energy via ultrasonic vibrations, typically at frequencies of about 10 to 50 kHz chosen to provide an adequate bond strength. When sufficient energy is applied, localized heating occurs and consequent movement of metal so that bonding occurs. This is "welding" without the addition of a third metal or high temperature melting, such as is commonly done with other welding methods. The exact nature of the bond has not been established but is referred to as "welding" as is common in the art. The ultrasonic energy is applied by contacting the surface to be bonded with a vibrating welding head, usually referred to as a "horn". The size and shape of the horn are not believed to be critical. As practiced in one embodiment of the present invention, the "horn" is a circular disc about one-half inch thick (12.7 mm) and about two inches (50.8 mm) in diameter. The edge of the disc contacts the top of the copper foil with a force sufficient to assure that the ultrasonic vibrations are transferred to the metals. A typical force may be up to 20 lbs. (4.45N). If the force is too great the copper foil can be damaged. If too small, the ultrasonic energy will be insufficient to bond the two sheets of metal.

It has been usual practice in ultrasonic welding to provide a roughened surface for the welding head in order to assure good contact with the surface to be welded. However, in welding copper foil to a thicker supporting sheet it has been found that a smooth welding head is preferred, since the usual roughened welding head may damage the copper foil. The process is particularly useful with thinner foils, such as 18 $\mu$m thick foil, which do not have much ability to resist forces placed upon them. Consequently, the foil could be moved by the reciprocating motion of the welding head. Not only can the foil be damaged, perhaps causing it to be discarded as scrap, but the foil can be buckled from the forces placed on it and thus forming ripples in the foil. The foil is then not flat against the supporting sheet and if used to laminate with an insulating substrate, the ripples could be pressed down and faulty circuit lines may result.

It has been found that in order to weld the copper foil so that it is flat on the supporting metal surface that tension should be applied to the foil while welding. Tension is applied longitudinally by the rollers which move the metal strips past the welding heads. Tension is applied also in the transverse direction. This prevents ripples from being formed and assures that the copper foil and its supporting sheet are flat and consequently that when panels are cut from the paired continuously welded strips, the cut edges are tight even though not welded or glued. One method which has been found useful in providing transverse tension on the copper foil is to place rollers under the supporting sheet inboard of the welding heads in order to place an upward force on the supporting sheet and through it to the copper foil. Other methods will occur to those skilled in the mechanical arts and the invention should not be considered limited to this method of providing tension to the copper foil.

Another factor which affects the results is the flatness of the edges of the metal sheets, particularly the thin copper foil. These edges ordinarily will have been cut during the manufacturing process and preferably they should be flat and not distorted by the shearing process or, if not, it may be necessary to take steps to correct the distortion.

Another consideration in the application of ultrasonic welding to copper foil is the quality of the surface being welded. Since electrodeposited copper foil has a smooth or shiny side with a low profile, i.e. an average roughness of say 1.5 to 2 μm while the matte side has a rougher profile, of say, 4 μm or more, it can be appreciated that the roughness of the surface will affect the conditions used for ultrasonic welding. In the typical case the smooth side of the foil will be in contact with the second metal while the matte side will be in contact with the welding head.

Although aluminum is a preferred material because of its relatively low cost and light weight, other metals could be used if desired, such as various types of steels. For example, stainless steel sheets could be used, which are more costly but stronger than aluminum and could substitute for the stainless steel plates used in laminating copper foils.

Figure 2:
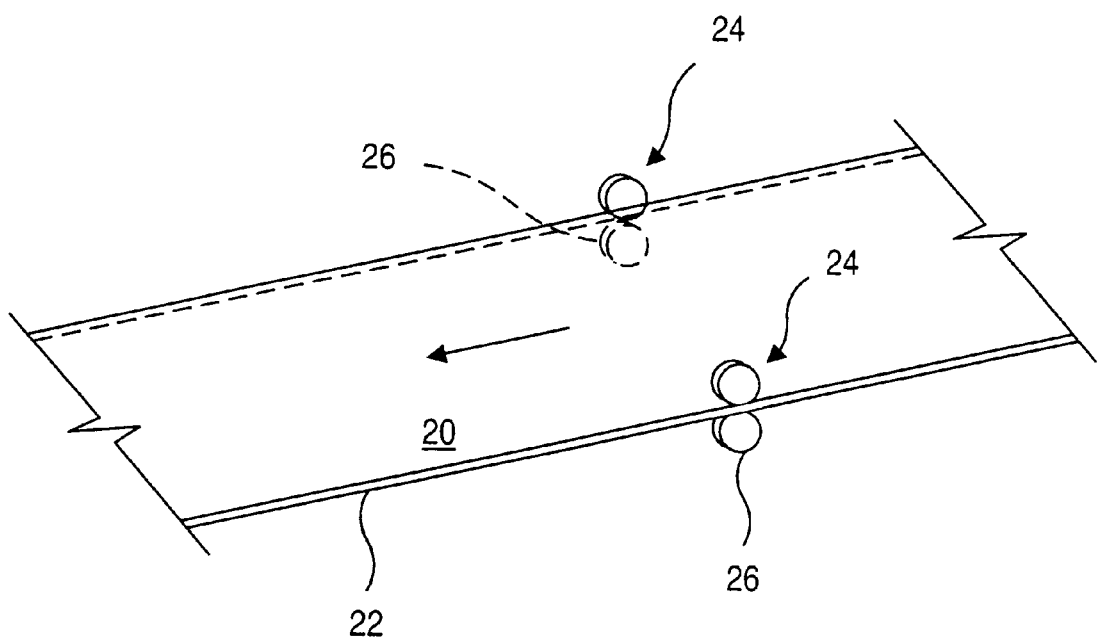
FIG. 2 is a partial perspective view of two strips of metal being ultrasonically welded at their edges.

A preferred embodiment of the process of the invention will be described in reference to FIG. 2, which shows in a partial perspective view the ultrasonic welding process as applied to the continuous welding of two strips of metal at their edges. A roll of copper foil 20 (18 μm) and a roll of aluminum sheet 22 (250 μm thick) are mounted so that the copper foil can be drawn over the aluminum sheet as both are passed over rollers (not shown) positioned just before the first of the pair of welding stations. Typically, the width of the strips will be 12 to 36 inches (304.8 to 914.4 mm). The paired sheets pass between the welding head 24 or "horn" and a metal idler wheel 26 against which the welding head is pressed. As mentioned above, just before the welding head 24 and idler 26 is mounted a roller on each side of the metal sheets and underneath them so as to provide pressure on the aluminum sheet, thus producing a transverse tension in the copper foil. Ultrasonic energy is applied at a frequency of about 40 kHz via the welding head acting against the metal idler wheel beneath the aluminum sheet. The force applied to the welding head is about 5 to 20 lbs. (1.11 to 4.45N). The two sheets of metal move through the welding head at about 5 to 30 m/min. The residence time of the metal sheets below the welding head is brief, only about 0.1 to 2 seconds, but it is sufficient to produce welding of the copper foil to the aluminum sheet. After passing the first welding head, the sheets may be passed to a second welding station similar to the first (not shown) which completes the process. Then, the welded sheets pass through the rollers which were used to apply pressure on the copper foil and aluminum sheet and to pull them through the welding process. If it is desired to weld a second sheet of copper foil on the other side of the aluminium sheet the process could be repeated, although simultaneous welding of two sheets of copper foil to opposite sides of an aluminum supporting sheet is feasible, although mechanically more complex.

Once welded together the copper and aluminum are passed to a shearing station where the continuous strips are cut into the desired panel sizes for subsequent use in making laminates and eventually, printed circuit boards. The industry uses a number of different panel sizes and generally the copper foil and aluminum rolls will be slightly wider than one of the desired dimensions. The welded strips of metal will be sheared at intervals which yield the second of the desired dimensions. The result is a uniform panel size e.g. 20 inches by 26 inches (508 mm by 660.4 mm). The edges of the two sheets of metal are congruent on each of the four sides, but only two edges are ultrasonically welded together.

It will be evident that the process of the invention requires simpler processing than is necessary to seal copper to aluminum panels completely along all four of the edges. The process of the invention can be carried out continuously and the positive seal by welding is applied on only two edges. Since the copper foil is flat against the supporting aluminum (or other metal) sheet, an effective seal is made at the cut ends of the panels so that further processing to positively seal the cut edges is considered unnecessary in most cases. This is a clear advantage which has not been available with the previously available products of similar nature, such as those described by Johnston. Additional sealing of the cut edges could be used, but is not preferred for most applications.

Since no adhesives are used contamination of the copper foil can be avoided. The seal of copper to aluminum by ultrasonic welding can be quite strong, in which case the sheared edges of the product may contain copper with a small amount of aluminum in it and aluminum containing a small amount of copper. These may not be objectionable when reclaiming the copper and aluminum scrap However, it is also feasible to adjust the degree of welding so that the bonding is sufficient to hold the copper and aluminum sheets together while laminating the copper to a substrate, but weak enough so that the cut edges containing both copper and aluminum can be manually separated with little or none of one metal left with the other metal. This can be done by adjusting the amount of pressure and the speed of movement of the copper and aluminum strips through the welding heads.

It should be appreciated by those of skill in the art that the techniques disclosed above represent techniques discovered by the inventor to function well in the practice of the invention, and thus can be considered to constitute preferred modes for its practice. However, those of skill in the art should, in light of the present disclosure, appreciate that many changes can be made in the specific embodiments which are disclosed and still obtain a like or similar result without departing from the spirit and scope of the invention.

What is claimed is:

1. A method for continuously ultrasonically welding a continuous strip of copper foil to a supporting continuous strip of a second metal comprising:

(a) drawing said strip of copper foil from a roll of copper foil;

(b) drawing said strip of second metal from a roll of said second metal;

(c) placing a surface of said strip of copper foil adjacent a surface of said strip of second metal and aligning the two edges of said strips;

(d) passing the aligned strips of copper foil and second metal between at least one ultrasonic welding station at each edge of the aligned strips, said ultrasonic welding stations comprising an ultrasonic welding head contacting said copper foil;

(e) applying ultrasonic energy to said copper foil and second metal with said ultrasonic welding head sufficient to continuously weld said copper foil to said second metal while applying tension to said copper foil transverse to the direction in which the aligned strips of copper foil and second metal are passed in (d).

2. A method of claim 1 further comprising passing said welded copper foil and second metal strips of (e) to at least a second ultrasonic welding station at each edge of the aligned strips and welding said copper foil and second metal at least a second time.

3. A method of claim 1 wherein said ultrasonic welding head is above said copper foil strip and a supporting metal idler is below said second metal.

4. A method of claim 1 wherein said ultrasonic welding head supplies energy at a frequency of 10–50 kHz.

5. A method of claim 1 further comprising shearing said welded strips of copper foil transverse to the weld, thereby forming panels of copper foil welded to said second metal at two edges.

6. A method of claim 1 wherein said second metal is aluminum.

7. A method of claim 1 wherein said second metal is steel.

8. A method of claim 7 wherein said steel is stainless steel.

9. A method of claim 1 wherein said ultrasonic welding head applies a force up to about 20 lbs. (4.45N) to said strips of copper foil and second metal.

10. A method of claim 1 wherein the contact time with said ultrasonic welding head is about 0.1 to 2 seconds.

11. A panel for use in making copper clad laminates wherein said panel comprises:

(a) a sheet of copper foil;

(b) a sheet of a second metal having edges congruent with said copper foil sheet;

(c) a linear ultrasonic weld adjacent two edges of said sheets, the weld securing said sheet of copper foil to said sheet of a second metal.

12. A panel of claim 11 wherein said second metal is aluminum.

13. A panel of claim 12 wherein said second metal is steel.

14. A panel of claim 13 wherein said steel is stainless steel.

15. A panel of claim 11 wherein said sheets of copper and second metal are rectangular and have only two edges ultrasonically welded.

16. A method of claim 1 wherein said weld formed in (e) is strong, and separation of said copper and second metal strips leaves portions of copper in the second metal strip and/or portions of second metal in the copper strip.

17. A method of claim 1 wherein said weld formed in (e) is weak, and separation of said copper and second metal strips leaves each of said strips free of contamination by the metal from the other strip.

18. A panel of claim 11 wherein said weld of (c) is strong, whereby when said copper and second metal strips are separated, a portion of said copper will be left in said second metal and/or a portion of said second metal is left in said copper.

19. A panel of claim 11 wherein said weld of (c) is weak, whereby when said copper and second metal strips are separated, each strip is free of contamination by metal from the other strip.

* * * * *

UNITED STATES PATENT AND TRADEMARK OFFICE
CERTIFICATE OF CORRECTION

PATENT NO. : 5,942,314
DATED : August 24, 1999
INVENTOR(S) : Brian K. Fisher, et. al.

It is certified that error appears in the above-identified patent and that said Letters Patent is hereby corrected as shown below:

Title page, item [73] Assignee:   Replace "Mitsui Mining & Smelting Co., Ltd." With --Oak-Mitsui--

Signed and Sealed this

Twenty-fourth Day of October, 2000

*Attest:*

Q. TODD DICKINSON

*Attesting Officer*   *Director of Patents and Trademarks*